(12) United States Patent  
Harris

(10) Patent No.: US 8,890,338 B2  
(45) Date of Patent: Nov. 18, 2014

(54) METHOD OF IDENTIFYING AND/OR PROGRAMMING AN INTEGRATED CIRCUIT

(75) Inventor: Edward B. Harris, Fogelsville, PA (US)

(73) Assignee: Agere Systems, Inc., Allentown, PA (US)

( * ) Notice: Subject to any disclaimer, the term of this patent is extended or adjusted under 35 U.S.C. 154(b) by 902 days.

(21) Appl. No.: 11/535,866

(22) Filed: Sep. 27, 2006

(65) Prior Publication Data

US 2008/0073789 A1    Mar. 27, 2008

(51) Int. Cl.
| | |
|---|---|
| *H01L 23/48* | (2006.01) |
| *H01L 23/52* | (2006.01) |
| *H01L 23/525* | (2006.01) |
| *H01L 23/544* | (2006.01) |
| *H01L 23/00* | (2006.01) |

(52) U.S. Cl.
CPC ............ *H01L 23/525* (2013.01); *H01L 23/544* (2013.01); *H01L 24/11* (2013.01); *H01L 2223/54433* (2013.01); *H01L 2223/5444* (2013.01)
USPC ..... 257/781; 257/459; 257/503; 257/E23.023

(58) Field of Classification Search
USPC ......... 257/459, 503, 737–738, 779, 780–781, 257/E23.02, E23.023
See application file for complete search history.

(56) References Cited

U.S. PATENT DOCUMENTS

| | | | | |
|---|---|---|---|---|
| 5,281,684 A | * | 1/1994 | Moore et al. .................. | 427/97.5 |
| 6,864,587 B2 | | 3/2005 | Shibata | |
| 2003/0030153 A1 | * | 2/2003 | Perry ............................ | 257/782 |
| 2008/0003718 A1 | * | 1/2008 | Estepa et al. .................. | 438/113 |

FOREIGN PATENT DOCUMENTS

| | | |
|---|---|---|
| JP | 57064941 | 4/1982 |
| JP | 5036683 | 2/1993 |
| JP | 2001135794 | 5/2001 |
| JP | 2005353728 | 12/2005 |

* cited by examiner

*Primary Examiner* — Thanhha Pham

(57) ABSTRACT

A chip and a method of fabricating the chip for low cost chip identification circuitry. In one embodiment, a method of manufacturing an integrated circuit includes formation of a multi-level metallization structure including a pad level comprising programming pads. A plurality of active devices are formed on a substrate, and multiple levels of metallization are formed over the active devices, connecting some of the active devices to form programmable circuitry. The programmable circuitry is connected to pairs of programming pads on the bond pad level. Programming pads in some of the pairs are selectively connected to one another by using conductive ink deposited with maskless inkjet printing techniques. The pads are then covered with a non-conductive protective layer.

8 Claims, 5 Drawing Sheets

10

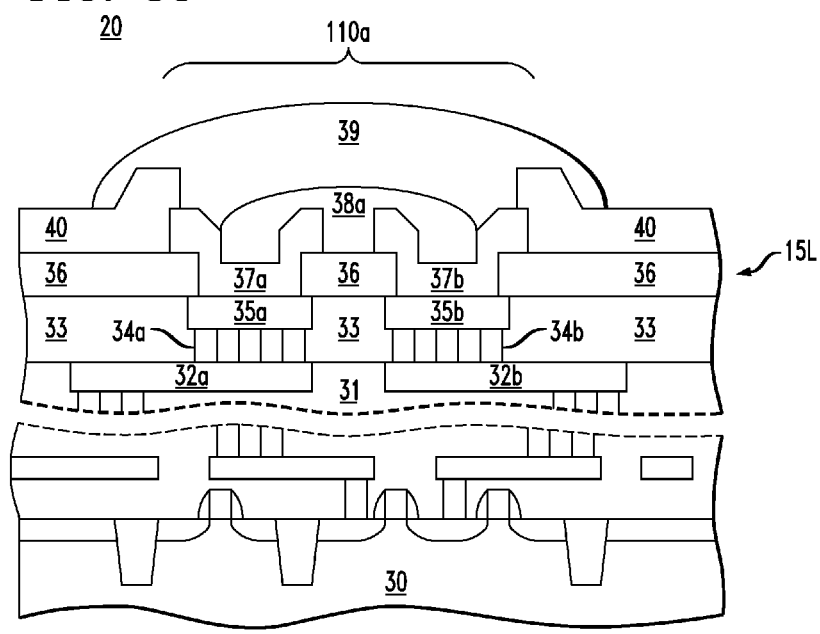
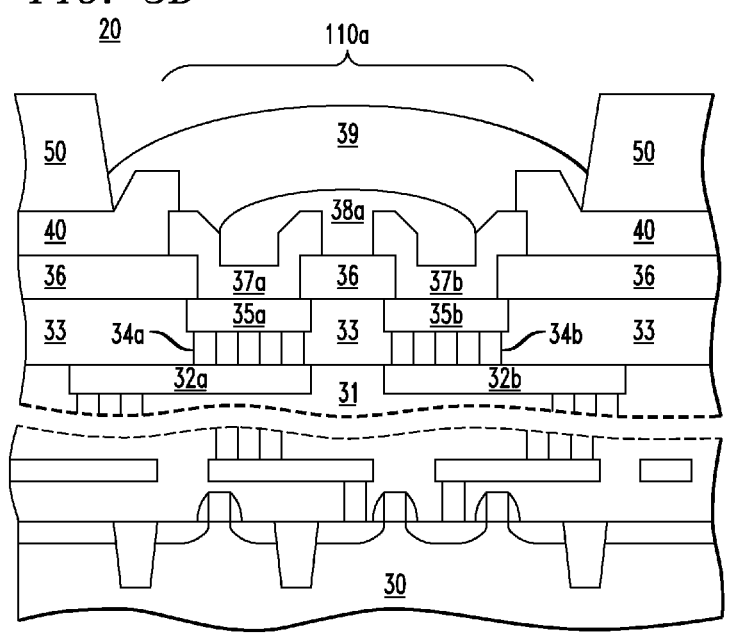

US 8,890,338 B2

METHOD OF IDENTIFYING AND/OR PROGRAMMING AN INTEGRATED CIRCUIT

FIELD OF THE INVENTION

This invention relates to semiconductor integrated circuits and, more particularly, to methods and designs for identification and personalization of semiconductor integrated circuits.

BACKGROUND AND SUMMARY OF THE INVENTION

In the manufacture of semiconductor integrated circuits, semiconductor chips are functionally tested at the wafer-level and then again after the chips are packaged. These tests are generally referred to as "wafer-level test" and "final test," respectively. The wafer-level test confirms circuit functionality and final test confirms that the packaged chip works as intended.

Integrated circuit identification information, sometimes referred to as "chip identification" information, may include process lot number, wafer number and position on the wafer, and/or a chip serial number. This information can be used to determine causes of integrated circuit failures which occur during normal testing, such as during final test, as well as during field operation. Without chip identification information it is often difficult to relate a failure to specific integrated circuit parameters.

In the manufacture of memory chips, redundant circuitry is often built into memory arrays to achieve full functionality when the array has a limited number of defective rows or columns. However, redundant circuitry increases the complexity of a integrated circuit and consumes costly die area. An alternative approach to the memory yield problem uses a large memory array divided into a plurality of sub-memory regions or blocks, and only the fully functional sub-memory regions are identified for use. A chip identification circuit is coupled to an on-chip memory control unit to provide information on the functional memory size. For the redundant memory approach, a chip identification circuit disables the defective row and/or column and substitutes a redundant row and/or column. See, for example, Cenker et al., U.S. Pat. No. 4,228,528. Both approaches rely on a form of chip identification for proper operation of the memory chip.

Other uses for chip identification involves "trimming" (i.e., electrically adjusting or modifying) individual chips after wafer processing is complete in order to, for example, provide compensation to analog circuits for manufacturing variation. It may also be used to provide chip "personalization," where certain functions of the chip are enabled or disabled after manufacture.

Conventional methods of encoding the foregoing types of chip identification information on an integrated circuit have been based on one-time programmable (OTP) read only memory (ROM) circuits formed in the chip. Programming mechanisms for OTP memory circuits include use of laser-blown fuses, electrically blown fuses and anti-fuses, and floating-gate technology. However, these techniques add significant cost to manufacturing the semiconductor integrated circuit. For example, floating-gate and anti-fuse ROM circuits may require additional wafer processing steps to form the structures to be programmed. And all of the techniques require additional circuitry that consumes costly silicon die area. Further, laser fusing requires precision alignment of the laser and the laser's energy must be tightly controlled to avoid damaging the chip being programmed.

SUMMARY OF THE INVENTION

One disclosed embodiment of the invention provides a fabrication method of manufacturing integrated circuit having a substrate. A plurality of active devices are formed on the substrate and multiple metallization levels are formed over the active devices to interconnect some of the active devices, thereby forming programmable circuitry. The multiple metal layers have a bond pad level on which programming pads are formed. The programming pads are wired to the programmable circuitry. Two or more of programming pads may be selectively coupled together to program the programmable circuitry.

Another disclosed embodiment of the invention is an integrated circuit having a semiconductor substrate, a plurality of active devices on the substrate, multiple metallization levels over the active devices, and programming pads. The multiple metallization levels have a bond-pad level and the programming pads are formed on the bond-pad level. Two or more of the programming pads are adapted to be selectively coupled to one another.

BRIEF DESCRIPTION OF THE FIGURES

The invention will be more clearly understood from the following description of some embodiments thereof, given by way of example only, with reference to the accompanying drawings; in which.

Like reference numbers are used throughout the figures to indicate like features. Individual features in the figures may not be drawn to scale.

DETAILED DESCRIPTION OF THE INVENTION

Figure 1:
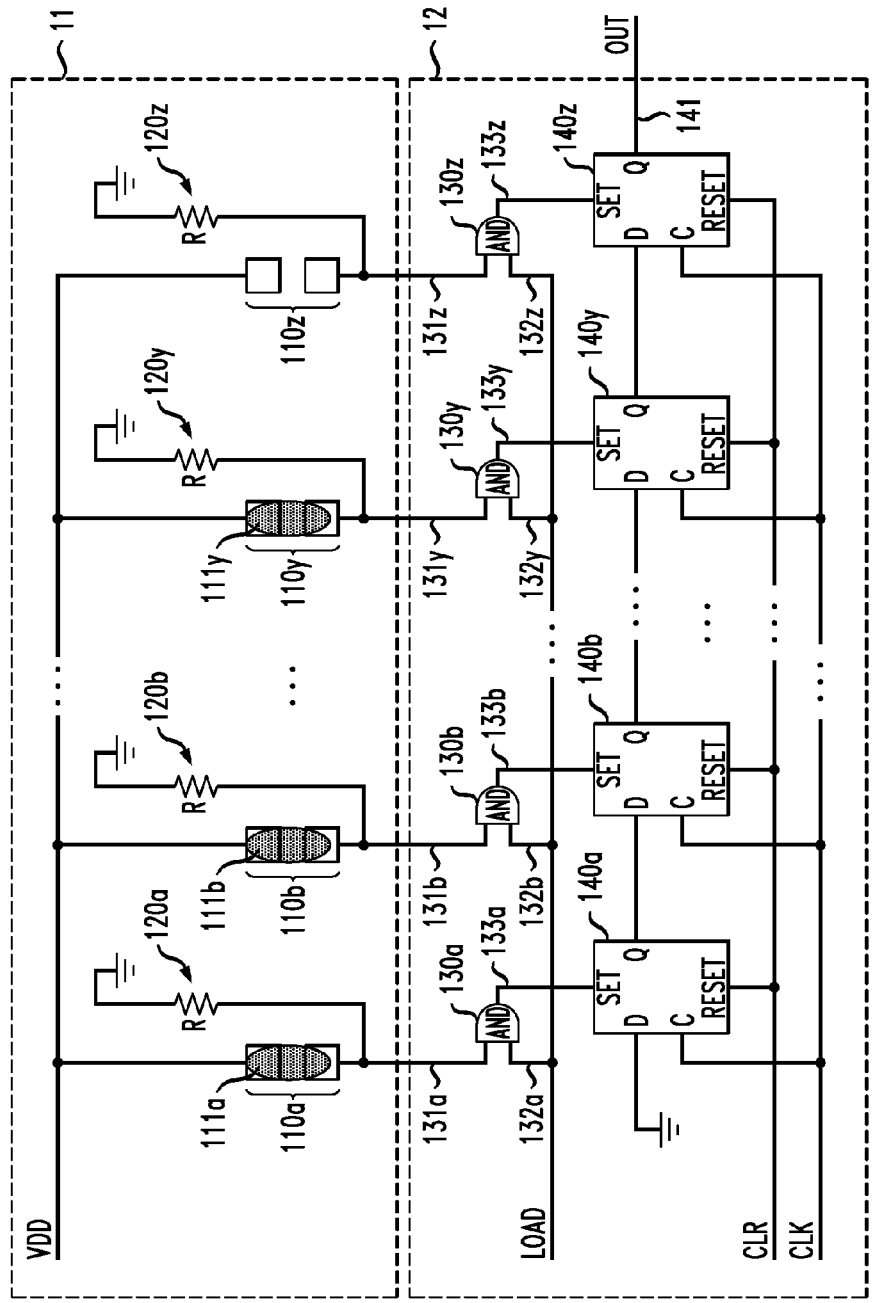
FIG. 1 schematically illustrates a chip identification circuit.

Referring to FIG. 1, a chip identification circuit 10, embodied in an integrated circuit or chip (not shown) and according to an embodiment of the present invention, comprises programming circuitry 11 and shift register circuitry 12. The programming circuitry 11 includes an exemplary sequence of pairs of spaced-apart programming pads 110a-110z adapted for selective connection or "programming." The sequence of pads 110a-110z is selectively programmed by the addition of a conductive link 111a-111y. In this example, pad pair 110z is not so programmed. In combination with resistors 120a-120z, for the pads in each pair that are separated, a logic-low state is indicated, while for the pads in each pair that are shorted together with the conductive link 111a-111y, a logic-high state is indicated. It is understood that the logic levels "high" and "low" are arbitrary and merely illustrate the functionality of the circuitry 11. Moreover, the pairs of pads 110a-110z may conduct analog signals or logic signals of any level between logic gates or other circuitry and are not limited to simple static logic applications. It is also understood that other configurations of the pads may be used.

Shift register circuitry 12 takes the logic values from the circuitry 11 for further application with in the integrated circuit. Each AND gate 130a-130z has a corresponding first input terminal 131a-131z, a corresponding second input terminal 132a-132z and a corresponding output terminal 133a-133z. The first input terminal 131a-131z of each AND gate 130a-130z is connected to one pad in the corresponding pair of pads 110a-110z. If a pair of pads is programmed to a logic-high state, the first AND gate input receives a voltage level based on a connection to $V_{DD}$. The second input 132a-132z to each AND gate 130a-130z is responsive to a LOAD signal. The LOAD is a logic-high voltage signal applied to second input 132a-132z, when the programmed sequence of pads 110a-110z are to be read. Thus the output terminal 133a-133z of each AND gate indicates the programmed status (logic-high or logic-low) of the pair of pads to which it is connected when the LOAD signal is asserted.

The shift register circuitry 12 also includes a plurality of flip-flops 140a-140z, connected to each other in series. Each flip-flop 140a-140z receives a logic-high or logic-low signal from a corresponding AND gate output terminal 133a-133z. To read the programming circuitry, the shift register circuitry is reset or cleared in response to a logic-high clear signal CLR. Then the data programmed into the pairs of pads 110a-110z is loaded into the flip-flops 140a-140z when the LOAD signals goes logical high, enabling the AND gates 130a-130z so that the logic value on each AND gate output terminal is stored in an associated flip-flop. The shift register circuitry 12 then generates a serial output signal corresponding to the logic levels stored in the flip-flops and in accord with a clock signal CLK which controls serial movement of values stored in the flip-flops from one flip-flop to a next flip flop and ultimately to the shift register output terminal 141.

In an embodiment of the invention wherein integrated circuits are placed in ball grid array packages, the programming of chip identification information can made in the programming circuitry 11 after wafer level testing is complete. Maskless deposition of conductive material (for example, by ink-jet discharge of a conductive ink comprising materials such as metallic particles, conductive polymer, or carbon particles) is performed on selected programming pads. The ink-jet discharge method is well known, being applied to manufacture of thin film transistor (TFT) liquid crystal display (LCD) devices having a pixel size as small as 12 μm. See, for example, http://www.epson.co.jp/e/newsroom/2005/news_2005_04_27.htm.

This may be followed by maskless deposition of a non-conducting, protective coating material (for example, ink-jet discharge of non-conducting epoxy). The functional dies are cut for individual packaging and solder balls are formed thereon for ball grid array packages. Alternatively, die singulation can be performed prior to maskless deposition of conductive material over the programming pads.

Figure 2A:
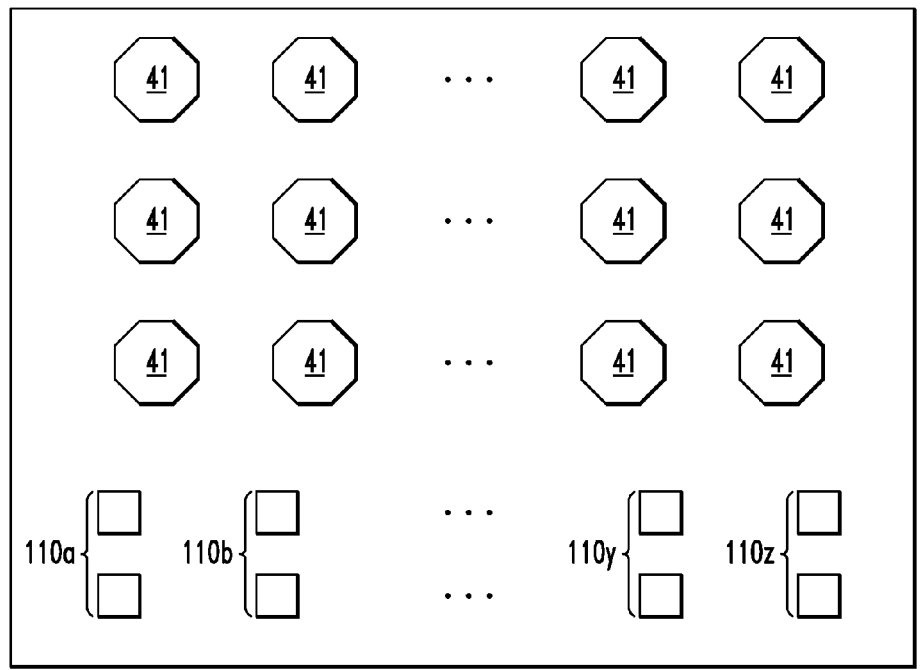
FIGS. 2A-2D are partial plan views of programming pads and solder ball pads after various stages of fabrication; and, FIGS. 3A-3D are partial cross-sectional views of the structure of FIGS. 2A-2D after various stages of fabrication.
Figure 2B:
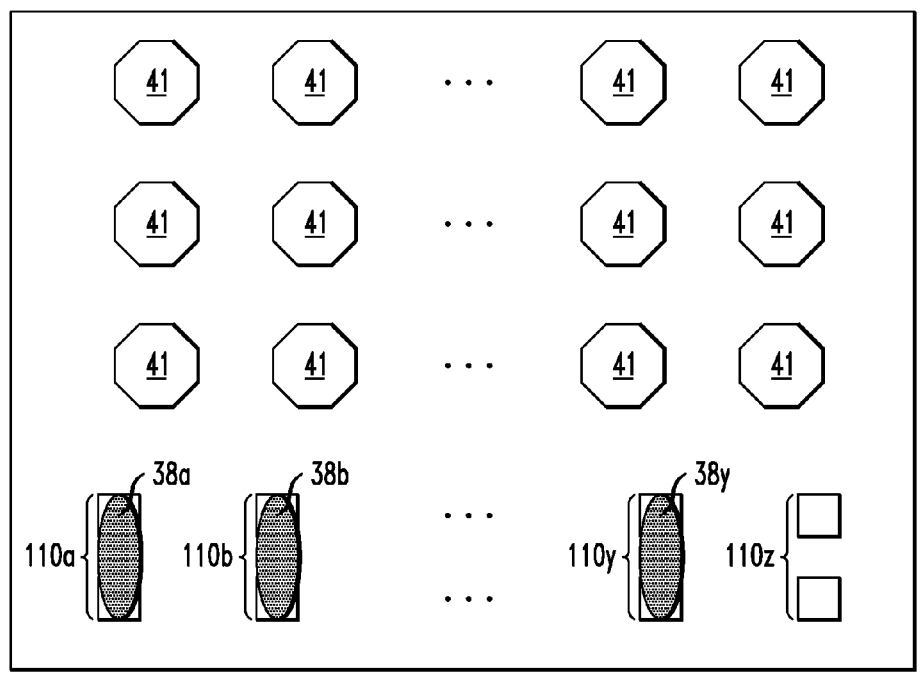
Figure 2C:
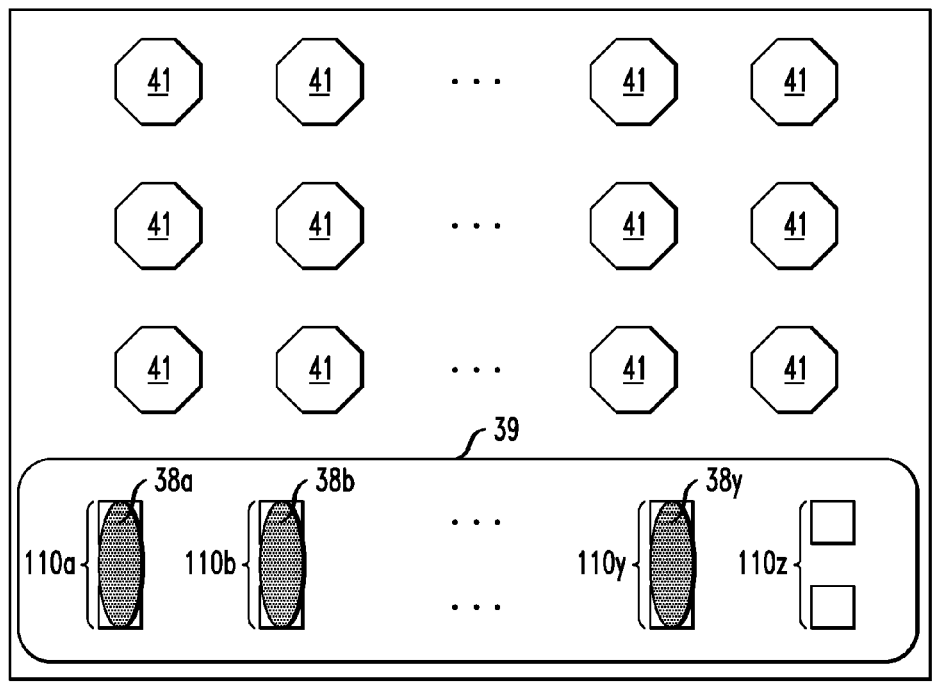
Figure 2D:
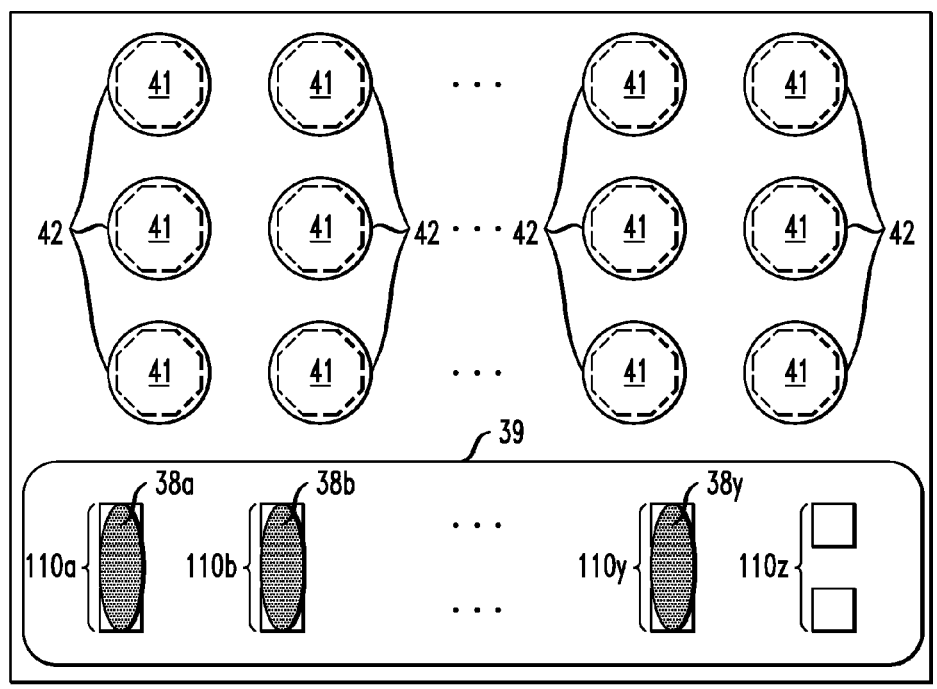

FIGS. 2A-2D sequentially illustrate, in partial plan views, programming pads and solder ball landing pads during a sequence of fabrication and programming steps. In FIG. 2A, a series of programming pad pairs 110a-110z are shown along with an array of solder ball landing pads 41, for receiving solder balls 42, formed on an upper level of metallization in an interconnect system. In this example, selected pairs of programming pads 110a-110y are connected by maskless selective deposition of conductive film 38a-38y as shown in FIG. 2B to provide a conductive link between pairs of pads 110a-110y, while pad pair 110z is not connected. In FIG. 2C, a non-conductive protective material 39 is shown deposited by a maskless deposition method over the entire programming pad area after the pairs 110a-110z are programmed. Preferably, as shown in FIG. 2D, solder balls 42 are then placed on the solder ball landing pads 41.

Figure 3A:
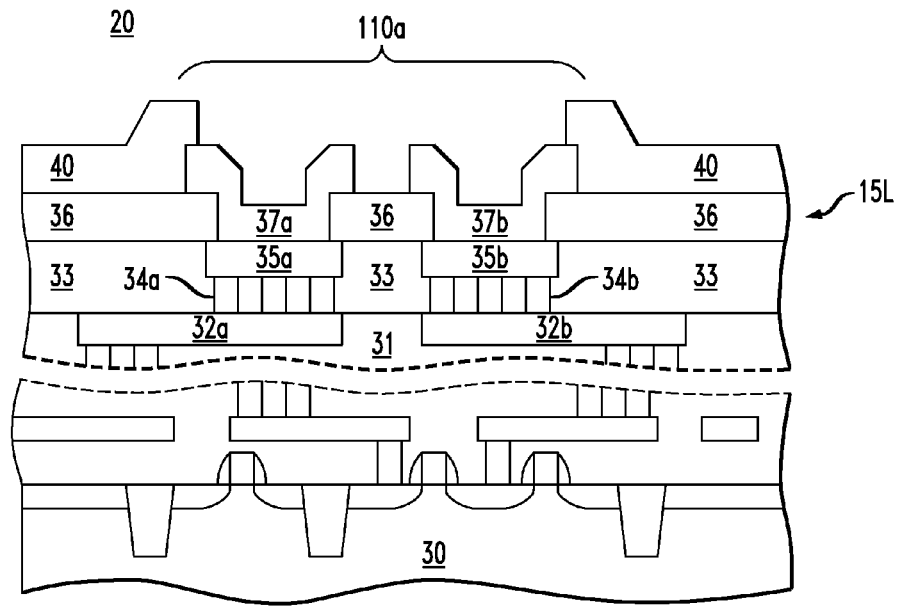
Figure 3B:
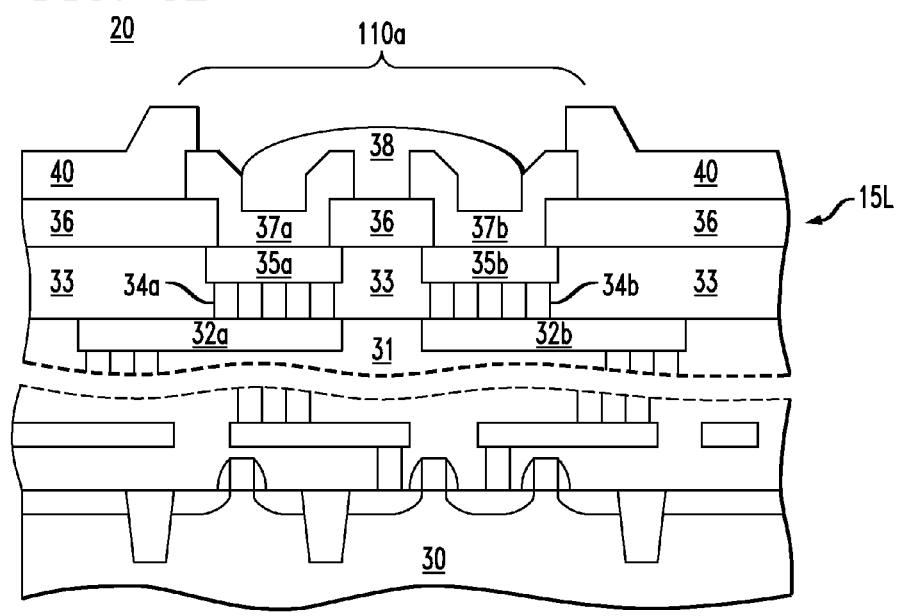

FIGS. 3A-3D are partial cross-sectional views, taken along by line A-A' of FIG. 2C, illustrating a portion of the programming circuitry 11 formed on a semiconductor substrate 30 of an integrated circuit 20 with maskless deposition of conductive material. In FIG. 3A individual metal contact pads 35a and 35b are shown formed on an upper level 15L (also referred to as a bond-pad level) of a multi-level interconnect structure. Each pad 35a, 35b is shown connected through a first passivation layer 36 to one of the pads 37a, 37b in the pair 110a of programming pads. In this example, one metal pad 35a is connected to the supply voltage $V_{DD}$ terminal through underlying metal vias 34a and metal runner segments 32a. The other metal pad 35b is connected to the AND gate 130a shown in FIG. 1 through underlying metal vias 34b and metal runner segments 32b. As shown in FIG. 3B, the conductive material 38a is deposited over and between the programming pads 37a and 37b by the maskless selective deposition method as discussed above Referring next to FIG. 3C, a non-conductive protective coating material 39, preferably a polymer such as epoxy, is deposited over the conductive material 38a and part of second passivation layer 40, preferably also by an ink-jet discharge method, to protect the programming pads from the environment. In lieu of depositing the protective coating over the programming pads with an ink-jet method, the second dielectric material 40 of the dual passivation structure used in solder ball packages may cover the programming pads.

The embodiment shown in FIGS. 2A-2D, 3A-3C may be utilized for testing the chip 20 at the wafer level or for final test after packaging the chip in a ceramic package or the like where the chip 20 remains exposed (a lid to the package is mounted after final test to completely seal the packaged chip). However, with conventional plastic packaging, the chip is completely encapsulated, making programming at final test essentially impossible. To address this shortcoming, FIG. 3D shows an alternative embodiment of the invention. While similar to that shown in FIG. 3C, a conventional plastic encapsulation layer 50 is added prior to the deposition of conductive material 38a and protective layer 39 but leaving the pads 37a, 37b and surrounding area expose. This allows for the programming of the integrated circuit 20 after encapsulation and during or after final test when plastic packaging is used. In this way, the chip 20 can be programmed at a convenient time and for purposes other than redundancy programming, such as programming a serial number into the chip. The protective layer 39 also completes encapsulation of the chip against environmental contamination.

The present invention may also be applied to the wire bond packages prior to encapsulation of the integrated circuit In such embodiments, after wafer level functional testing, and the maskless selective deposition of conductive material is performed on selected programming pads, the individual die are cut and sorted for packaging. Wire bonding is then performed followed by encapsulation of each die.

The foregoing description and drawings merely explain and illustrate the invention, and the invention is not limited thereto, as those skilled in the art will be able to make modifications and variations to the system and method without departing from the scope of the invention which is only limited by the claims which now follow.

I claim:
1. An integrated circuit, comprising:
a semiconductor substrate;
a plurality of active devices on the semiconductor substrate;
multiple metallization levels over the active devices, the multiple metallization layers including a bond pad level; and, a plurality of programming pads formed on the bond-pad level;

a plastic package encapsulating at least said multiple metallization levels, wherein the encapsulating plastic package has an opening over two or more of the plurality of programming pads;

wherein the two or more of the plurality of programming pads are adapted to program a programmable circuit by selectively coupling two or more of said plurality of programming pads together, wherein the two or more programming pads are coupled to one another by a printed conductive ink deposited using an ink jet printer after an encapsulation of one or more of said multiple metallization levels, wherein the opening is at least partially filled with a protective coating.

2. The integrated circuit of claim 1, wherein at least one of said encapsulated multiple metallization levels comprise a printed conductive ink deposited thereon using an ink jet printer.

3. The integrated circuit of claim 1, wherein the conductive ink comprises metallic particles, conductive polymer, or carbon particles.

4. The integrated circuit of claim 1, wherein the multiple metallization levels interconnect some of the active devices to form programmable circuitry.

5. The integrated circuit of claim 4, wherein the programming pads are coupled to the programmable circuitry by the multiple metallization levels.

6. The integrated circuit of claim 1, further comprising a protective coating over the programming pads.

7. The integrated circuit of claim 6, wherein the protective coating is non-conductive.

8. The integrated circuit of claim 7, wherein the protective coating is epoxy.

* * * * *